United States Patent
Vorenkamp et al.

[11] Patent Number: 5,999,026
[45] Date of Patent: Dec. 7, 1999

[54] RESYNCHRONIZATION DEVICE

[75] Inventors: Pieter Vorenkamp, Ifs; Hervé Marie, St Aubin Sur Mer, both of France

[73] Assignee: U.S. Philips Corporation, New York, N.Y.

[21] Appl. No.: 09/054,113

[22] Filed: Apr. 2, 1998

[30] Foreign Application Priority Data

Apr. 2, 1997 [FR] France .................................... 97 03999
Sep. 17, 1997 [FR] France .................................... 97 11580

[51] Int. Cl.$^6$ ...................................................... H03K 5/13
[52] U.S. Cl. ........................... 327/156; 327/147; 327/165; 375/359
[58] Field of Search .................................... 327/141, 144, 327/154, 165, 202, 147, 150, 156, 159; 375/359

[56] References Cited

U.S. PATENT DOCUMENTS 5,212,601  5/1993  Wilson ........................................ 360/51
5,574,756  11/1996  Jeong ........................................ 375/376
5,638,015  6/1997  Gujral et al. ............................... 327/144
5,781,480  7/1998  Nogle et al. ........................ 365/189.04

FOREIGN PATENT DOCUMENTS

0716501A1  6/1996  European Pat. Off. .

*Primary Examiner*—Tuan T. Lam
*Attorney, Agent, or Firm*—Brian J. Wieghaus

[57] ABSTRACT

Starting from an input signal (data) and a clock signal (clk), this device supplies an output signal (CKREF0) identical to the input signal but resynchronized with the clock signal. It comprises two cascaded D-type flip-flops (63, 65), the clock signal of the second flip-flop being inverted (62) with respect to that of the first flip-flop. The first flip-flop has its output coupled to the data input of the second flip-flop via a multiplexer (64), which is controlled by a signal (d-Ph) containing information about the phase relationship between the input signal and the clock signal, in such a manner that either input signal or the signal from the first flip-flop is applied to the input of the second flip-flop. This device can be used in a known phase control loop comprising an oscillator whose frequency is controllable, a frequency divider, and a phase comparator.

4 Claims, 1 Drawing Sheet

RESYNCHRONIZATION DEVICE

BACKGROUND OF THE INVENTION

The present invention relates to an integrated circuit comprising, inter alia, a resynchronization module having a clock input for a clock signal, a signal input for input data signal, and an output, which module includes a D-type flip-flop having its signal input coupled to the signal input of the module and having its clock input coupled to the clock input of the module.

It also relates to a liquid crystal display device.

The invention applies to those cases which require two signals having frequencies of which one is a multiple of the other and whose transitions are perfectly in phase. It applies, inter alia, to an interface for liquid crystal displays, for deriving the pixel frequency from the line clock frequency.

A synchronization module can be formed by a simple D-type flip-flop. A more sophisticated arrangement including a D flip-flop, whose signal input and clock input form the corresponding inputs of the arrangement, is described in the document EP 0 716 501. Starting from an input signal and a clock signal, this arrangement supplies a first and a second indication of the detection of a signal transition, these two indications being identical when the clock is in phase with the signal.

SUMMARY OF THE INVENTION

It is an object of the invention to provide an arrangement which, starting from an input signal and a clock signal, supplies a signal which is identical to the input signal but in synchronism with the clock signal, even when an edge of the clock signal is in quasi-coincidence with a signal edge (in such a case, when a simple D-type flip-flop is used, the change of state cannot be anticipated and the edge could be missed).

To this end, this module comprises, for producing on its output, starting from the input signal and the clock signal, a signal identical to the input signal but synchronized with the clock signal, a second D-type flip-flop having its clock input coupled to that of the first flip-flop via an inverter and having its output coupled to the output of the module, and the output of the first flip-flop is coupled to the data signal input of the second flip-flop via a multiplexer, controlled by a digital control signal containing information about the phase relationship between the input data signal and the clock signal, so as to apply either the input data signal or the signal from the first flip-flop to the second flip-flop.

In a particular application, the integrated circuit comprises, in addition, a frequency multiplier device of the PLL type, followed by a phase shifter having:

an input coupled to the output of the multiplier device,
an output, and
means for delivering on this output a signal which has been phase shifted with respect to the signal on its output, the multiplier device comprising:

an oscillator having an output for supplying a signal whose frequency is controllable by a voltage applied to a control input,
a frequency divider having an input coupled to the output of the oscillator and having an output for supplying a signal whose frequency has been divided with respect to that of the oscillator signal, and
a phase comparator having two inputs, of which one input is intended for receiving a reference signal and of which the other input is coupled to the output of the divider, and having an output coupled to the control input of the oscillator, the resynchronization module having its clock input coupled to the output of the phase shifter and having its signal input coupled to the output of the divider.

Nowadays, a liquid crystal display device generally comprises a programmable delay line so as to enable the phase of the line synchronization signal to be controlled, which allows the sampling instants of video signals to be optimized, which delay line is followed by a phase-locked loop circuit, referred to as PLL, for generating the pixel clock by multiplication of the line frequency.

Such a device advantageously includes an integrated circuit in accordance with the invention, comprising a frequency multiplier of the PLL type, the associated phase shifter and the resynchronization module, the input of the multiplier being coupled to a connection carrying a line synchronization signal so as to generate, on the one hand, a signal of pixel frequency, starting from the line synchronization signal, and, on the other hand, a new line synchronization signal synchronized with the signal of pixel frequency.

Thus, phase control of the pixel clock is effected after the frequency multiplication, in contradistinction to known systems where the delay is introduced before the frequency multiplication. This is made possible by the use of a resynchronization module in accordance with the invention and it enables the whole liquid crystal display device to be implemented in a simpler way and at the same time its performance to be improved.

Preferably, in the device having means for processing color signals and having an analog-to-digital converter for each color signal, the signal of pixel frequency from the phase shifter is supplied to said an analog-to-digital converter to control the sampling instants of this converter.

These and other more detailed aspects of the invention will be apparent from the following description of an embodiment of the invention given by way of non-limitative example.

DESCRIPTION OF THE PREFERRED EMBODIMENTS

Figure 1:
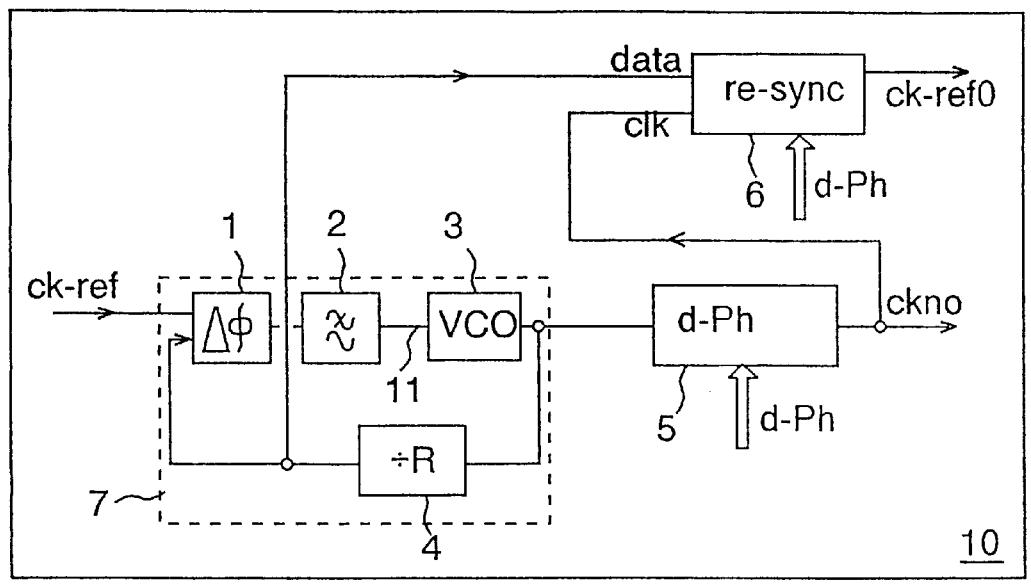
FIG. 1 is a circuit diagram of a part of an integrated circuit using a resynchronization module in accordance with the invention in conjunction with a device comprising a phase-locked loop.

The integrated circuit 10 shown in FIG. 1 supplies two signals, of which one signal has a frequency which is a multiple of that of the other and whose edges are perfectly in phase, the phase shift of said signals with respect to a clock signal remaining constant while the signals vary in frequency. It includes a phase-locked loop 7, referred to as PLL, comprising:

an oscillator 3 whose frequency is controllable by means of a voltage applied to a connection 11 and whose output supplies an oscillator signal,
a divider 4 which divides the frequency of the oscillator signal in a ratio of R,
a phase comparator 1, which compares the phase of the signals applied to the one and the other of its two inputs, of which the one input is coupled to a reference signal "ck-ref" and of which the other input is coupled to the output of the frequency divider 4. The comparison signal supplied by the comparator is applied to the connection 11 via a low-pass filter 2 in order to control the frequency of the oscillator 3.

The device further comprises a phase shifter 5 whose phase shift is programmable. This phase shifter has an input coupled to the oscillator signal and supplies on its output "ckno" a signal which is phase-shifted relative to the input signal, the magnitude of this shift being controlled by a digital control signal d-Ph.

The device finally comprises a resynchronization module 6, which will be described in detail with reference to FIG. 2; this module has:

a clock input "clk" coupled to the output of the phase shifter 5, a signal input "data" coupled to the output of the divider 4, an output which forms an output "ck-ref0" of the device, and and input for the digital information signal d-Ph.

The control signal "d-Ph" thus controls, on the one hand, the value of the desired phase shift in the phase shifter and, on the other hand, the resynchronization module 6.

Figure 2:
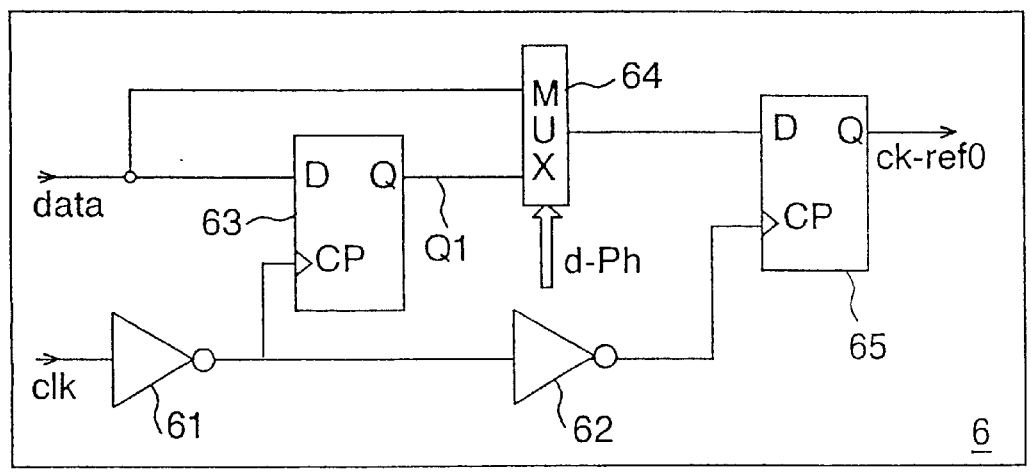
FIG. 2 shows a resynchronization module in greater detail.

FIG. 2 shows the resynchronization module 6, in which like terminals bear the same reference signs as in FIG. 1. This module has the same inputs and output as a D-type flip-flop, i.e. an input "data" adapted to receive the data, an input "clk" adapted to receive a clock signal, and an output "ck-ref0" adapted to supply sampled data.

The module comprises a first flip-flop 63 of the D type and a second flip-flop 65 of the same type. The clock input of the flip-flop 63 receives the clock signal "clk". Here, an inverter 61 is interposed between the clock input CP of the flip-flop and the clock input "clk"; this inverter is not always necessary, this depends on the sign of the available clock signal clk. The clock input of the flip-flop 65 receives the same clock after a second inversion in an inverter 62. The data signal input of the flip-flop 63 is coupled to the input "data" of the module. The output of the flip-flop 65 forms the output "ck-ref0" of the module and its input is coupled to the output of a multiplexer 64. The latter is controlled by the signal d-Ph which contains information about the phase relationship between the signal on the input "data" and that on the input "clk", as a result of which either the data signal on the input "data" or the signal Q1 from the flip-flop 63 is selected. When the signals "data" and "clk" coincide the signal "data" is first synchronized on a falling edge of the clock signal in the flip-flop 63, which yields the signal Q1, which is resynchronized on a rising edge of the clock signal in the flip-flop 65. When "data" and "clk" do not coincide, which is indicated by a particular value of the signal d-Ph, the multiplexer 64 selects the signal on the input "data", which signal is then resynchronized by the flip-flop 65. Though synchronized, the signals "clk" and "ck-ref0" generally do not have the same frequency: the clock signal has, for example, a frequency which is multiple of that of the data signal.

The signal d-Ph can be generated specifically to be supplied this module, for example with the aid of an arrangement derived from that described in the aforementioned document, which arrangement detects if the signals are in phase. However, in most cases this is not necessary because a suitable signal is already available in another part of the circuit; this is the case for the circuit shown in FIG. 1, which forms an application of the module of FIG. 2.

Figure 3:
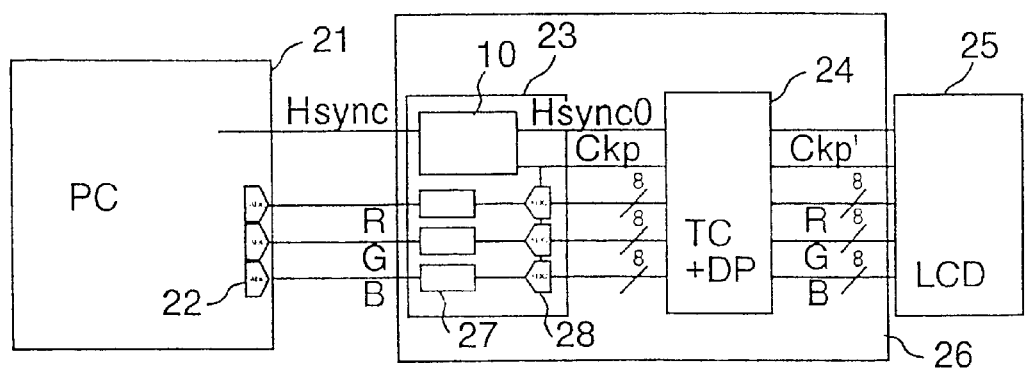
FIG. 3 shows diagrammatically a color display device of the liquid crystal type for a computer.

A computer as referenced 21 in FIG. 3, for example of the PC type, usually comprises very fast digital-to-analog converters, such as the one referenced 22, for deriving analog signals, intended for a display device of an arbitrary type, from the R, G, B color signals available in digital form in the computer. Moreover, line synchronization signals Hsync are supplied (as well as frame signals not shown, which are not processed by the circuit in accordance with the invention).

Here, the display device is of the liquid crystal type. A driver module 26 processes the analog signals so as to adapt them to the actual liquid crystal display device 25 and comprises:

a time conversion and digital processing circuit 24, which is known per se and which derives from a pixel clock signal Ckp, a line synchronization signal Hsync0 and digital color signals R, G, B a clock signal Ckp' and R, G, B color signals adapted to drive the liquid crystal display device 25, and an interface circuit 23, which notably comprises:

for each color a circuit, one of which is referenced 27, comprising a black-level clamp and a variable-gain amplifier, followed by a analog-to-digital converter, one of which is referenced 28, which again supplies the R, G, B color signals in digital form, for the line synchronization a circuit 10 similar to that shown in FIG. 1, which circuit supplies two signals of which one signal has a frequency which is multiple of that of the other signal and whose transitions are perfectly in phase.

In the circuit 10 the divider 4 has a dividing ratio equal to the ratio between the pixel frequency and the frequency Hsync, which it receives on its signal input Hsync (ck-ref in FIG. 1), and on its output it supplies:

a clock signal Ckp (ckno in FIG. 1) whose phase cannot be varied and which is also transferred to the analog-to-digital converters 28 to control their sampling instants, and a line synchronization signal Hsync0 (ck-ref0 in FIG. 1), which is resynchronized with the signal Ckp.

We claim:

1. An integrated circuit comprising: a resynchronization module having a module clock input for a clock signal, a module signal input for an input data signal, a module output, a first D-type flip-flop having a signal input coupled to the module signal input and a clock input coupled to the module clock input, a second D-type flip-flop having a data signal input, and a clock input coupled to the clock input of the first flip-flop via an inverter, and an output coupled to the module output, a multiplexer coupling the output of the first flip-flop to the data signal input of the second flip-flop, the multiplexer being controlled by a digital control signal containing information about the phase relationship between the input data signal and the clock signal, so as to apply either the input data signal or the signal from the first flip-flop to the second flip-flop, the second D-type flip-flop thereby producing on the module output, starting from the input data signal and the clock signal, a signal identical to the input data signal but sychronized with the clock signal.

2. An integrated circuit as claimed in claim 1, further comprising, a frequency multiplier device of the PLL type, followed by a phase shifter having:

a phase shifter input coupled to an output of the multiplier device, a phase shifter output, and means for delivering at the phase shifter output a signal phase shifted with respect to the signal received at the phase shifter input, the multiplier device comprising:

an oscillator having an oscillator output for supplying an oscillator signal whose frequency is controllable by a voltage applied to a control input, a frequency divider having an input coupled to the oscillator output and having an output for supplying a signal whose frequency has been divided with respect to that of the oscillator signal, and a phase comparator having two inputs, one of the phase comparator inputs receiving a reference signal and the other phase comparator input being coupled to the output of the divider, and an output coupled to the control input of the oscillator, the module clock input coupled to the output of the phase shifter and the module signal input coupled to the output of the divider.

3. A liquid crystal display device, comprising:

a frequency multiplier of the PLL type, the frequency multiplier receiving a line synchronization signal and outputting a multiplied line signal and a divided, multipled line signal;

a phase shifter coupled to receive the multiplied line signal and outputting a phase shifted multiplied line signal; and a resynchronization module comprising a first module input receiving the phase shifted multiplied line signal, a second module input receiving the divided, multiplied line signal, a module output, a first D-type flip-flop having a signal input coupled to the second module input and a clock input coupled to the first module input, a second D-type flip-flop having a signal input, and a clock input coupled to the clock input of the first flip-flop via an inverter, and an output coupled to the module output, a multiplexer coupling the output of the first flip-flop to the signal input of the second flip-flop, the multiplexer being controlled by a digital control signal containing information about the phase relationship between the divided, multiplied line signal and the phase shifted multiplied line signal, so as to apply either the divided, multiplied line signal or the output of the first flip-flop to the second flip-flop, wherein the phase shifted multiplied line signal is a signal of pixel frequency and an output signal at the module output is a new line synchronization signal which is synchronized with the signal of pixel frequency.

4. A liquid crystal display device as claimed in claim 3, further including a device which processes color signals and an analog-to-digital converter for each color processed signal, the signal of pixel frequency from the phase shifter being supplied to said analog-to-digital converter to control the sampling instants of this converter.

* * * * *